United States Patent
Tsao et al.

(10) Patent No.: US 10,404,227 B1
(45) Date of Patent: Sep. 3, 2019

(54) QUATERNARY/TERNARY MODULATION SELECTING CIRCUIT AND ASSOCIATED METHOD

(71) Applicant: Elite Semiconductor Memory Technology Inc., Hsinchu (TW)

(72) Inventors: Szu-Chun Tsao, Yilan County (TW); Deng-Yao Shih, Changhua County (TW)

(73) Assignee: Elite Semiconductor Memory Technology Inc., Hsinchu (TW)

( * ) Notice: Subject to any disclaimer, the term of this patent is extended or adjusted under 35 U.S.C. 154(b) by 0 days.

(21) Appl. No.: 15/922,908

(22) Filed: Mar. 15, 2018

(51) Int. Cl.
| H03F 3/217 | (2006.01) |
| H03F 1/02  | (2006.01) |
| H03F 1/32  | (2006.01) |
| H03F 3/187 | (2006.01) |
| H03K 21/02 | (2006.01) |
| H03K 19/20 | (2006.01) |
| H03K 5/24  | (2006.01) |

(52) U.S. Cl.
CPC .......... *H03F 3/217* (2013.01); *H03F 1/0205* (2013.01); *H03F 1/32* (2013.01); *H03F 3/187* (2013.01); *H03F 2200/03* (2013.01); *H03F 2200/171* (2013.01); *H03F 2200/351* (2013.01); *H03K 5/24* (2013.01); *H03K 19/20* (2013.01); *H03K 21/026* (2013.01)

(58) Field of Classification Search
USPC ........................................ 330/10, 251, 207 A
See application file for complete search history.

(56) References Cited

U.S. PATENT DOCUMENTS 8,841,965 B2 * 9/2014 Nagashima ......... H03F 3/45475
330/10
2018/0076806 A1 * 3/2018 Yamauchi ................ H03K 7/08

* cited by examiner

*Primary Examiner* — Hieu P Nguyen
(74) *Attorney, Agent, or Firm* — Winston Hsu

(57) ABSTRACT

A quaternary/ternary modulation selecting circuit of an amplifier includes: a signal generating circuit, a detecting circuit, and a selecting circuit. The signal generating circuit is arranged to generate a ternary signal and a quaternary signal. The detecting circuit coupled to the signal generating circuit is arranged to generate a mode selecting signal according to at least the ternary signal. The selecting circuit coupled to the signal generating circuit and the detecting circuit is arranged to select and output one of the ternary signal and the quaternary signal to an output stage of the amplifier according to the mode selecting signal.

18 Claims, 5 Drawing Sheets

QUATERNARY/TERNARY MODULATION SELECTING CIRCUIT AND ASSOCIATED METHOD

BACKGROUND OF THE INVENTION

1. Field of the Invention

The present invention relates to an audio amplifier, and more particularly, to a quaternary/ternary modulation selecting circuit of an audio amplifier, and an associated method.

2. Description of the Prior Art

In audio applications, an analog amplifier is one of the most important parts in an audio system. Efficiency is a critical issue; a class D power amplifier is the most popular kind used in audio systems due to its higher efficiency compared to other kinds of amplifier. Because the output waveform of the class D power amplifier is a modulation signal between two voltage levels (i.e. supply voltage and ground) rather than a common linear waveform, ideally no current will pass through when the transistors of the output stage are non-conductive. Currently, a common modulation method applied in the class D power amplifier is Pulse Width Modulation (PWM), wherein quaternary modulation has the advantages of better total harmonic distortion (THD) and lower noise; ternary modulation, however, has the advantages of better efficiency and better Electro Magnetic Interference (EMI) performance. Therefore, a novel architecture of the class D amplifier which can combine the above advantages and can be utilized the ternary modulation and the quaternary modulation according to different power conditions is required.

SUMMARY OF THE INVENTION

One of the objectives of the present invention is to provide a quaternary/ternary modulation selecting circuit and an associated method to solve the above-mentioned problem.

According to an embodiment of the present invention, a quaternary/ternary modulation selecting circuit of an amplifier is disclosed, comprising: a signal generating circuit, a detecting circuit, and a selecting circuit. The signal generating circuit is arranged to generate a ternary signal and a quaternary signal. The detecting circuit coupled to the signal generating circuit is arranged to generate a mode selecting signal according to at least the ternary signal. The selecting circuit coupled to the signal generating circuit and the detecting circuit is arranged to select and output one of the ternary signal and the quaternary signal to an output stage of the amplifier according to the mode selecting signal.

According to an embodiment of the present invention, a quaternary/ternary modulation selecting method of an amplifier is disclosed, comprising: generating a ternary signal and a quaternary signal; generating a mode selecting signal at least according to the ternary signal; and selecting and outputting one of the ternary signal and the quaternary signal to an output stage of the amplifier according to the mode selecting signal.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the description and following claims to refer to particular components. As one skilled in the art will appreciate, manufacturers may refer to a component by different names. This document does not intend to distinguish between components that differ in name but not function. In the following description and in the claims, the terms "include" and "comprise" are used in an open-ended fashion, and thus should not be interpreted as a close-ended term such as "consist of". Also, the term "couple" is intended to mean either an indirect or direct electrical connection. Accordingly, if one device is coupled to another device, that connection may be through a direct electrical connection, or through an indirect electrical connection via other devices and connections.

Figure 1:
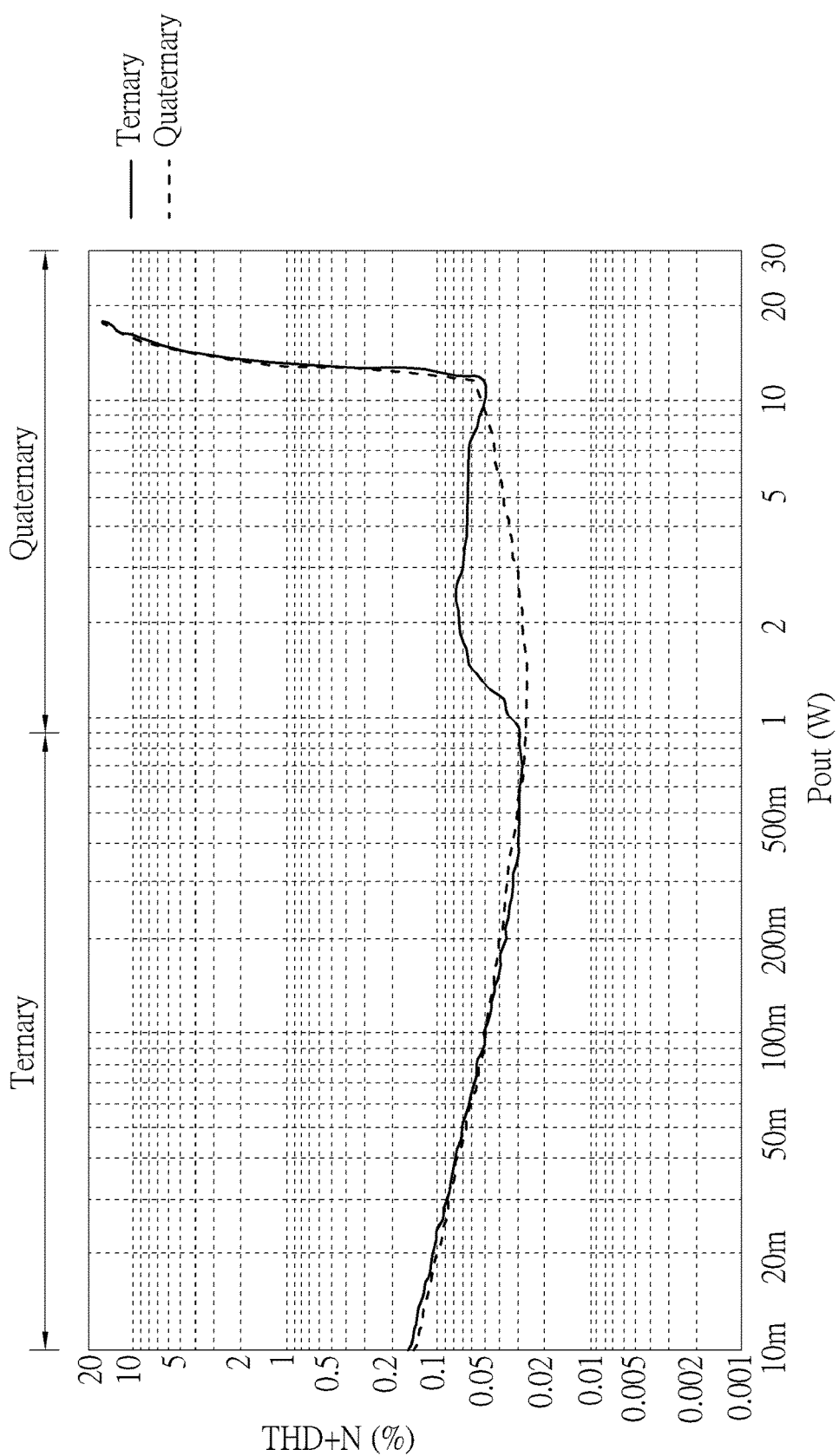
FIG. 1 is a diagram illustrating resolutions under the ternary mode and the quaternary mode in response to the output power of the class D amplifier.

FIG. 1 is a diagram illustrating total harmonic distortion and noise under the ternary mode and the quaternary mode in response to the output power of a class D amplifier. As shown in FIG. 1, when a small output power is targeted, both the quaternary mode and the ternary mode have similar total harmonic distortion and noise; however, when the large output power is targeted, the total harmonic distortion and noise is better than when the quaternary mode is entered. In addition, a relatively small idle current is recognized under the ternary mode when the small output power is targeted. To combine the strengths of the ternary mode and the quaternary mode, the present invention proposes a novel architecture of the class D amplifier which utilizes the ternary mode when a small output power is targeted and the quaternary mode when a large output power is targeted to solve the aforementioned problems.

Figure 2:
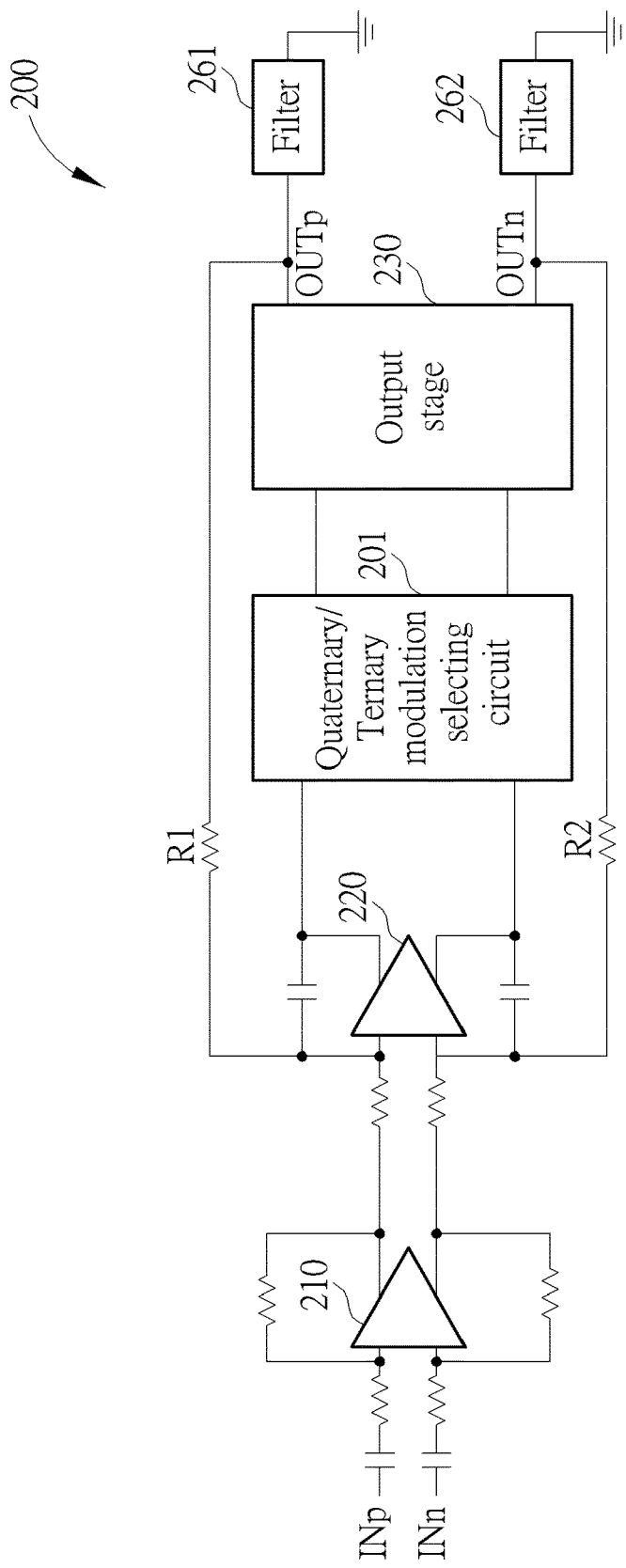
FIG. 2 is a diagram illustrating an audio amplifier with a quaternary/ternary modulation selecting circuit according to an embodiment of the present invention.

FIG. 2 is a diagram illustrating an audio amplifier 200 with a quaternary/ternary modulation selecting circuit 201 according to an embodiment of the present invention. In this embodiment, the audio amplifier 200 is a class D power amplifier, and the audio amplifier 200 comprises a gain stage 210, an integrator 220, the quaternary/ternary modulation selecting circuit 201, an output stage 230, two feedback resistors R1 and R2, and two filters 261 and 262, wherein the quaternary/ternary modulation selecting circuit 201 is arranged to generate a quaternary signal and a ternary signal, and select and output one of the quaternary signal and the ternary signal to the output stage 230 which determines the modulation scheme, and the output stage 230 generates an output signal comprising a positive wave OUTp and a negative wave OUTn. The other components are similar to corresponding parts of a traditional class D power amplifier; as their function should be well-known to a person skilled in the art, a detailed description is omitted here for brevity.

Figure 3:
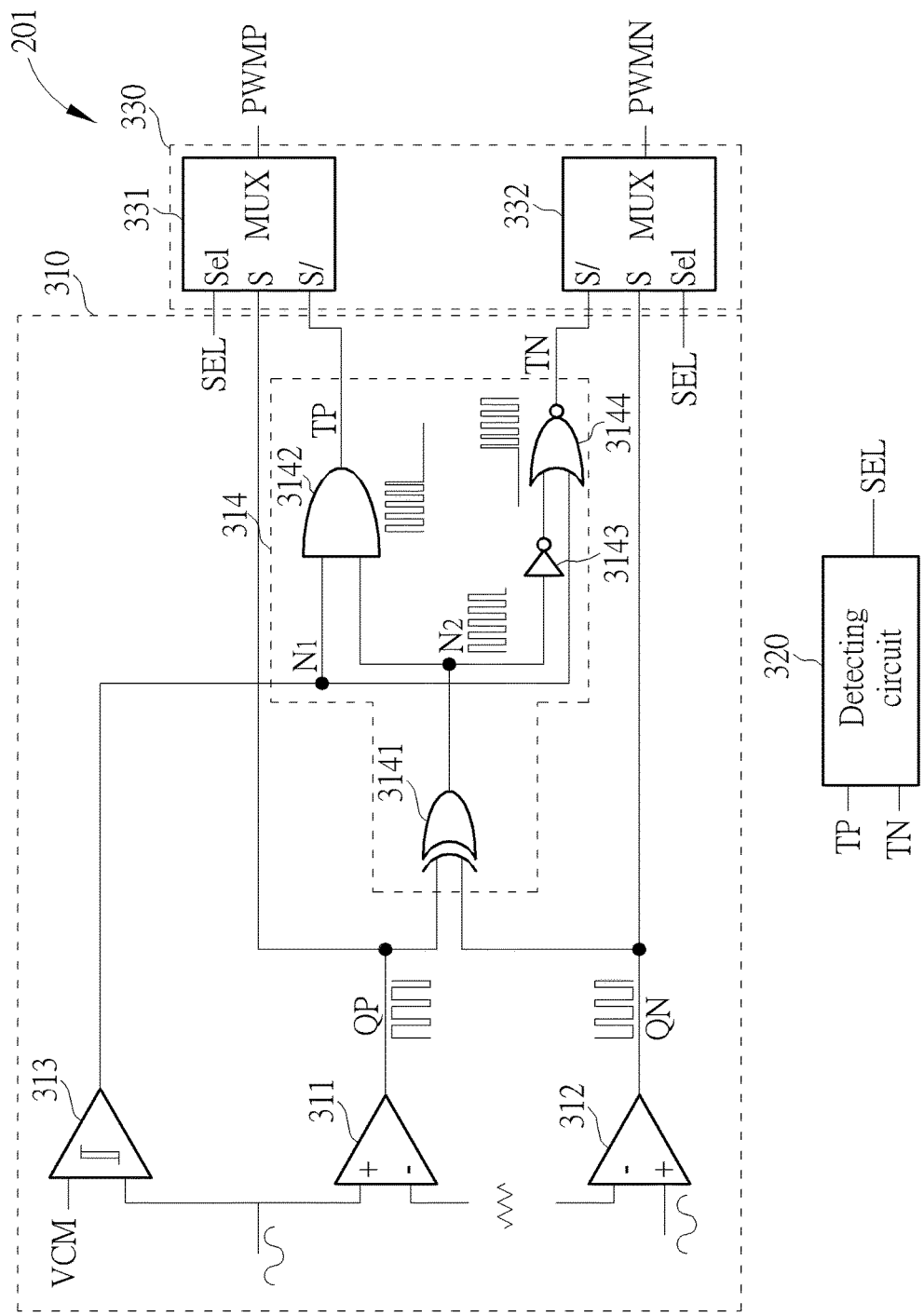
FIG. 3 is a diagram illustrating the quaternary/ternary modulation selecting circuit according to an embodiment of the present invention.

FIG. 3 is a diagram illustrating the quaternary/ternary modulation selecting circuit 201 according to an embodiment of the present invention. As shown in FIG. 3, the quaternary/ternary modulation selecting circuit 201 comprises a signal generating circuit 310, a detecting circuit 320 and a selecting circuit 330. The signal generating circuit 310 comprises comparators 311, 312, and 313, and a ternary signal generating circuit 314. The comparators 311 and 312 are arranged to compare the output signals of the integrator 220 with a triangular wave in order to generate the quaternary signal comprising a positive quaternary wave QP and a negative quaternary wave QN. The ternary signal generating circuit 314 is arranged to generate the ternary signal comprising a positive ternary wave TP and a negative ternary wave TN according to the quaternary signal. More specifically, the ternary signal generating circuit 314 comprises a general ternary wave generating circuit 3141 for generating a general ternary wave according to the positive quaternary wave QP and the negative quaternary wave QN; and the comparator 313 is arranged to compare a common voltage VCM with one of the output signals of the integrator 220, wherein the output of the comparator 313 is coupled to a node N1 as shown in FIG. 3. In this embodiment, the common voltage VCM is set to be half a supply voltage VDD, i.e. VDD/2, but this is not a limitation of the present invention. More specifically, the general ternary wave generating circuit 3141 is implemented by an XOR gate whose inputs are coupled to the outputs of the comparators 311 and 312, i.e. the positive quaternary wave QP and the negative quaternary wave QN, and the general ternary wave generating circuit 3141 generates a general ternary wave to a node N2. In addition, the ternary signal generating circuit 314 further comprises an AND gate 3142, an inverter 3143 and a NOR gate 3144, wherein the AND gate 3142 receives signals from the nodes N1 and N2 to generate the positive ternary wave TP, an input of the inverter 3143 is coupled to the node N2, and the NOR gate 3144 receives signals from the node N1 and an output of the inverter 3143 to generate the negative ternary wave TN.

The detecting circuit 320 is arranged to receive the ternary signal comprising the positive ternary wave TP and the negative ternary wave TN, and generate a mode selecting signal SEL according to at least the positive ternary wave TP and the negative ternary wave TN. The selecting circuit 330 comprises two multiplexers (MUXs) 331 and 332, wherein an input terminal, an inverting input terminal and a selecting terminal of the MUX 331 are respectively coupled to an output terminal of the positive quaternary wave QP, the positive ternary wave TP and the mode selecting signal SEL; and an input terminal, an inverting input terminal and a selecting terminal of the MUX 332 are respectively coupled to the negative quaternary wave QN, the negative ternary wave TN and the signal mode selecting signal SEL. In addition, the output terminal of the MUXs 331 and 332 are coupled to the output stage 230 of the audio amplifier 200. It should be noted that the architecture of the quaternary/ternary modulation selecting circuit 201 arranged to generate the quaternary signal and the ternary signal is only for illustrative purposes. Those skilled in the art should readily understand that the quaternary/ternary modulation selecting circuit 201 can be implemented by different architectures.

Figure 4:
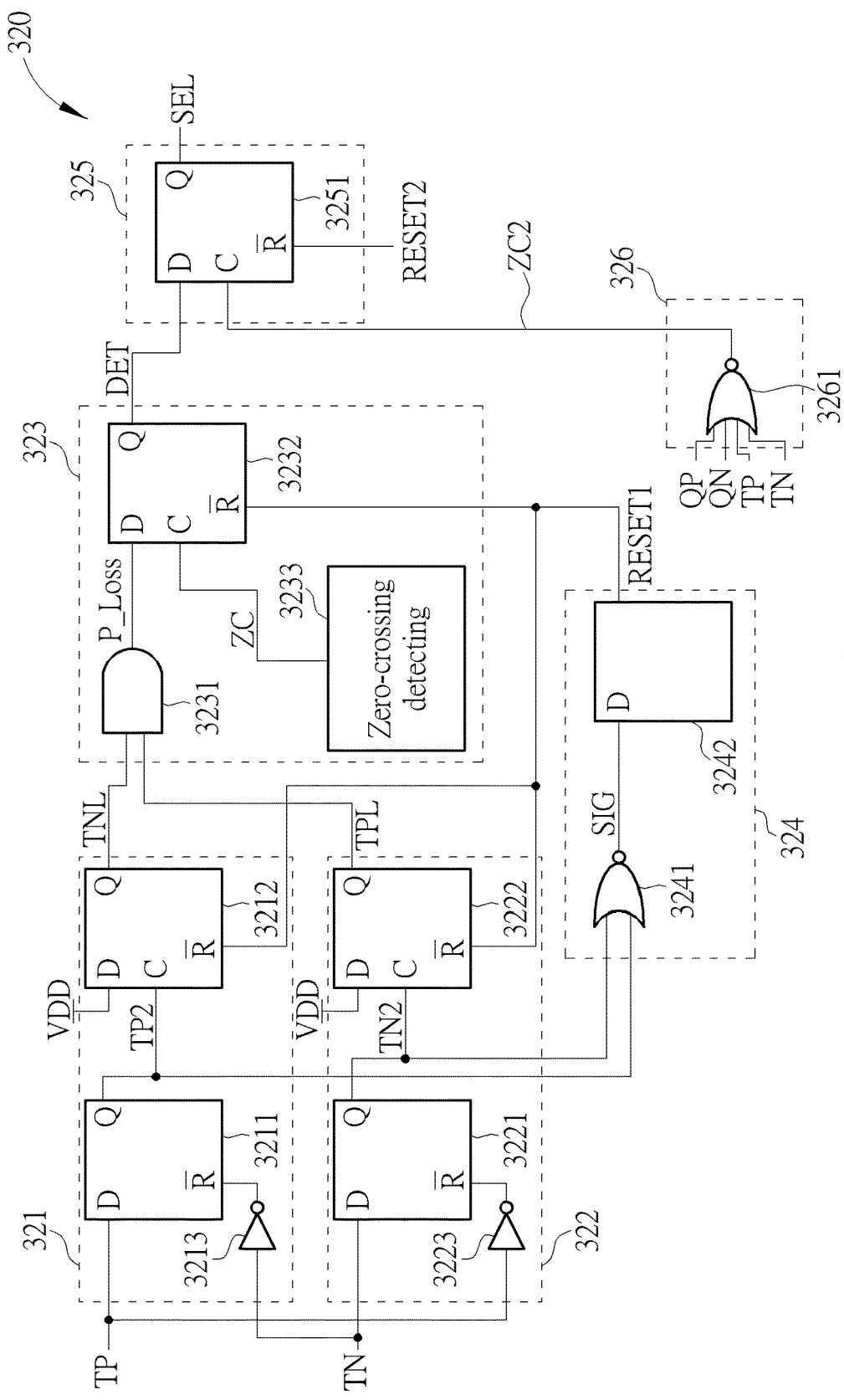
FIG. 4 is a diagram illustrating the detecting circuit according to an embodiment of the present invention.

FIG. 4 is a diagram illustrating the detecting circuit 320 according to an embodiment of the present invention. As shown in FIG. 4, the detecting circuit 320 comprises counting circuits 321 and 322, a pulse loss determining circuit 323, a reset circuit 324, an output circuit 325, and a zero-level detecting circuit 326. The counting circuit 321 comprises a counter 3211, a latching circuit 3212 and an inverter 3213. In this embodiment, the counter 3211 and the latching circuit 3212 can be implemented by, but not limited to, a D flip-flop. An input terminal of the inverter 3213 is coupled to the negative ternary wave TN. An input terminal of the counter 3211 is coupled to the positive ternary wave TP while a reset terminal of the counter 3211 is coupled to an output terminal of the inverter 3213. Theoretically, when the output signal of the amplifier 200 tends to have large power, one of the positive ternary wave TP and the negative ternary wave TN tends to have intense pulses while the other has no pulse. In this embodiment, when a predetermined number of pulses (e.g. two pulses) in the positive ternary wave TP have been counted by the counter 3211 while no pulse in the negative tenary wave TN has been counted by the counter 3211, meaning the output signal of the amplifier 200 tends to have a large power, a counting signal TP2 generated at an output terminal of the counter 3211 goes high, i.e. the counting signal TP2 has the logic value '1'. An input terminal of the latching circuit 3212 is coupled to the supply voltage VDD while a clock terminal of the latching circuit 3212 is coupled to the counting signal TP2. When a rising edge of the counting signal TP2 is detected by the latching circuit 3212, a signal TNL having the logic value '1' is generated at an output terminal of the latching circuit 3212 which indicates that no pulse in the negative ternary wave TN has been counted, i.e. a pulse loss phenomenon occurs to the negative ternary wave TN.

The counting circuit 322 comprises a counter 3221, a latching circuit 3222 and an inverter 3223. In this embodiment, the counter 3221 and the latching circuit 3222 can be implemented by, but not limited to, a D flip-flop. An input terminal of the inverter 3223 is coupled to the positive ternary wave TP. An input terminal of the counter 3221 is coupled to the negative ternary wave TN while a reset terminal of the counter 3221 is coupled to an output terminal of the inverter 3223. Theoretically, when the output signal of the amplifier 200 tends to have large power, one of the positive ternary wave TP and the negative ternary wave TN tends to have intense pulses while the other has no pulse. In this embodiment, when two pulses in the negative ternary wave TN have been counted by the counter 3221 while no pulse in the positive ternary wave TP has been counted by the counter 3221, meaning the output signal of the amplifier 200 tends to have a large power, a counting signal TN2 generated at an output terminal of the counter 3221 goes high, i.e. the counting signal TN2 has the logic value '1'. An input terminal of the latching circuit 3222 is coupled to the supply voltage VDD while a clock terminal of the latching circuit 3222 is coupled to the counting signal TN2. When a rising edge of the counting signal TN2 is detected by the latching circuit 3222, a signal TPL having the logic value '1' is generated at an output terminal of the latching circuit 3222 which indicates that no pulse in the positive ternary wave TP has been counted, i.e. a pulse loss phenomenon occurs to the positive ternary wave TP.

The pulse loss determining circuit 323 comprises a pulse loss logic circuit 3231, a latching circuit 3232 and a zero-crossing detecting circuit 3233. In this embodiment, the latching circuit 3232 can be implemented by, but not limited to, a D flip-flop. In addition, the pulse loss logic circuit 3231 is implemented by an AND gate in this embodiment; this is not a limitation of the present invention. The pulse loss logic circuit 3231 is arranged to generate a pulse loss signal P_Loss according to the signals TPL and TNL. The zero-crossing detecting circuit 3233 is arranged to perform a zero-crossing detection upon the input signals INp and INn of the amplifier 200 to generate a zero-crossing signal ZC, wherein the zero-crossing signal ZC indicates whether the input signal of the amplifier 200 reaches a zero voltage level. An input terminal of the latching circuit 3232 is coupled to the pulse loss signal P_Loss while a clock signal is coupled to an output terminal of the zero-crossing detecting circuit 3233, wherein when a rising edge of the zero-crossing signal ZC is detected by the latching circuit 3232, meaning the input signals INp and INn of the amplifier 200 reaches the zero voltage level, the pulse loss signal P_Loss is outputted as a determining signal DET at an output terminal of the latching circuit 3232. More specifically, when both the signals TPL and TNL have the logic value '1', i.e. each of the counting signals TP2 and TN2 has the logic value '1' at least once, the pulse loss determining circuit 323 determines that the pulse loss phenomenon has occurred to both the positive ternary wave TP and the negative ternary wave TN at least once. The power-loss signal P_Loss having the logic value '1' is thereby outputted as the determining signal DET.

The zero-level detecting circuit 326 comprises a NOR gate 3261, wherein the NOR gate 3261 receives the positive quaternary wave QP, the negative quaternary wave QN, a positive ternary wave TP and the negative ternary wave TN, and generates a zero-crossing signal ZC2. The zero-crossing signal ZC2 indicates whether the positive quaternary wave QP, the negative quaternary wave QN, a positive ternary wave TP and the negative ternary wave TN all reach the zero voltage level.

The output circuit 325 comprises a latching circuit 3251, wherein the latching circuit 3251 can be implemented by, but not limited to, a D flip-flop in this embodiment. An input terminal of the latching circuit 3251 is coupled to the determining signal DET while a clock terminal of the latching circuit 3251 is coupled to the zero-crossing signal ZC2. When a rising edge of the zero-crossing signal ZC2 is detected by the latching circuit 3251, meaning the positive quaternary wave QP, the negative quaternary wave QN, a positive ternary wave TP and the negative ternary wave TN all reach the zero voltage level, the determining signal 'DET' is outputted as the mode selecting signal SEL. More specifically, when the pulse loss determining circuit 323 determines that the pulse loss phenomenon has occurred to both the positive ternary wave TP and the negative ternary wave TN at least once, i.e. the input signal of the amplifier 200 tends to have large power. The determining signal DET having the logic value '1' is outputted as the mode selecting signal SEL. Accordingly, the selecting circuit 330 selects and outputs the quaternary signal (i.e. the positive quaternary wave QP and the negative quaternary wave QN) to the output stage 230.

The reset circuit 324 comprises a NOR gate 3241 and a counting circuit 3242, wherein the counting circuit 3242 can be implemented by, but not limited to, a D flip-flop in this embodiment. The NOR gate 3241 receives the counting signals TP2 and TN2 and generates a signal SIG. An input terminal of the counting circuit 3242 is coupled to the signal SIG. When the output signal of the amplifier 200 tends to have small power, the positive ternary wave TP and the negative ternary wave TN have alternate pulses. In this way, both the counting signals TP2 and TN2 have the logic value '0', and the pulse loss phenomenon no longer exists. When the counting circuit 3242 receives the signal SIG having the logic value '1' (due to the counting signals TP2 and TN2 being logic value '0') for a predetermined time period, e.g. 1 second, the counting circuit 3242 generates a reset signal RESET1 at an output terminal of the counting circuit 3242, and outputs the reset signal RESET1 to the latching circuits 3212, 3222 and 3232. In this way, the determining signal DET having the logic value '0' is outputted as the mode selecting signal SEL. Accordingly, the selecting circuit 330 selects and outputs the ternary signal (i.e. the positive ternary wave TP and the negative ternary wave TN) to the output stage 230. It should be noted that the latching circuit 3251 may further comprise a reset terminal which is coupled to a reset signal RESET2 for resetting the latching circuit 3251.

It should be noted that the proposed architecture discloses a scheme to enter into the quaternary mode from the ternary mode and return to the ternary mode from the quaternary mode; however, this is not a limitation of the present invention. The proposed architecture can be adapted to implement entering into the quaternary mode from the ternary mode or entering into the ternary mode from the quaternary mode. For example, as mentioned above, when the pulse loss determining circuit 323 determines that the pulse loss phenomenon has occurred to both the positive ternary wave TP and the negative ternary wave TN at least once, the output signal of the amplifier 200 tends to have large power. The determining signal DET having the logic value '1' is outputted as the mode selecting signal SEL. Accordingly, the selecting circuit 330 selects and outputs the quaternary signal (i.e. the positive quaternary wave QP and the negative quaternary wave QN) to the output stage 230. A different mechanism can also be adapted to implement return back to the ternary mode from the quaternary mode instead of using the proposed mechanism.

Figure 5:
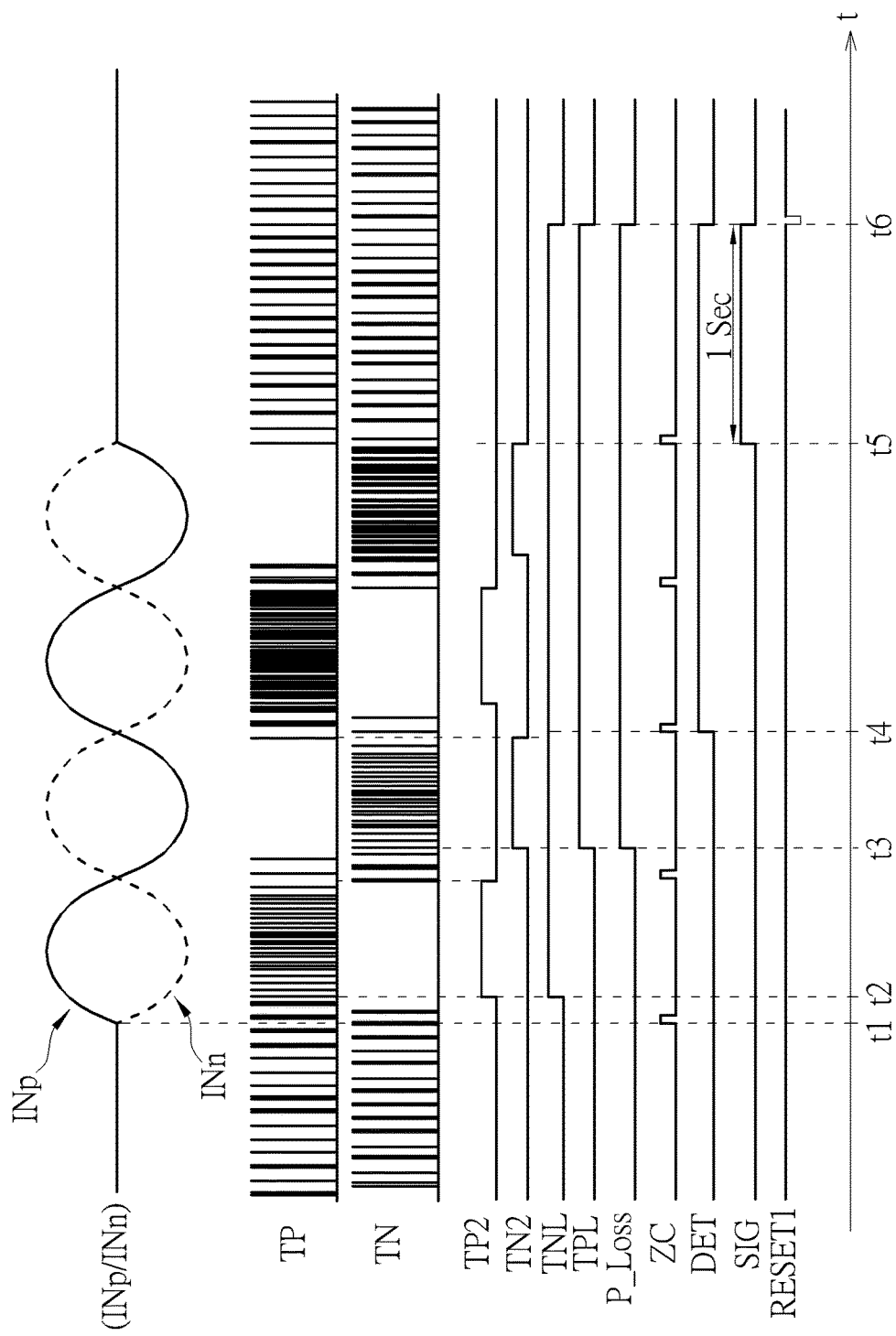
FIG. 5 is a diagram illustrating the waveforms of the signals shown in FIG. 4 according to an embodiment of the present invention.

FIG. 5 is a diagram illustrating the waveforms of the signals shown in FIG. 4 according to an embodiment of the present invention. As shown in FIG. 5, from the time point $t_1$ to $t_5$, the input signals (represented by the differential of the positive wave INp and the negative wave INn) of the amplifier 200 tends to have a large voltage swing. At the time point $t_2$, two pulses in the positive ternary wave TP have been counted by the counter 3211 while no pulse in the negative ternary wave TN has been counted by the counter 3211, and the counting signal TP2 goes high. The counting signal TP2 therefore triggers the latching circuit 3212, and the signal TPL having the logic value '1' is outputted. At the time point $t_3$, two pulses in the negative ternary wave TN have been counted by the counter 3221 while no pulse in the positive ternary wave TP has been counted by the counter 3221, and the counting signal TN2 goes high. The counting signal TN2 therefore triggers the latching circuit 3222, and the signal TPL having the logic value '1' is outputted. Via the pulse loss logic circuit 3231 which is implemented by an AND gate, the pulse loss signal P_Loss goes high too. At the time point $t_4$, the zero-crossing detecting circuit 3233 detects the input signal of the amplifier 200 reaches the zero voltage level, and outputs the zero-crossing signal ZC having the logic value '1'. The Pulse loss signal P_Loss is thereby outputted as the determining signal DET. The determining signal DET having the logic value '1' will be outputted as the mode selecting signal SEL instructing the selecting circuit 330 to select and output the quaternary signal when the zero-crossing signal ZC2 indicates that the positive quaternary wave QP, the negative quaternary wave QN, the positive ternary wave TP and the negative ternary wave TN all have the zero voltage level.

At the time point $t_5$, the output signal of the amplifier 200 tends to have small power, and both the counting signals TP2 and TN2 have the logic value '0'. Through the characteristic of the NOR gate 3241, the signal SIG goes high, and the counting circuit 3242 counts for a predetermined time period, e.g. 1 second. At the time point $t_6$, the reset signal RESET1 is outputted to reset the latching circuits 3212, 3222, and 3232. The signals TNL, TPL, the pulse loss signal P_Loss and the determining signal DET go down. The determining signal DET having the logic value '0' will be outputted as the mode selecting signal SEL instructing the selecting circuit 330 to select and output the ternary signal when the zero-crossing signal ZC2 indicates that the positive quaternary wave QP, the negative quaternary wave QN, the positive ternary wave TP and the negative ternary wave TN all have the zero voltage level.

Briefly summarized, the present invention proposes an architecture of the class D amplifier which utilizes the ternary modulation when a small output power is targeted and utilizes the quaternary modulation when a large output power is targeted. In this way, when the output power is small, the amplifier has a relatively small idle current, and when the output power is large, the amplifier has a better resolution.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A quaternary/ternary modulation selecting circuit of an amplifier, comprising:
    a signal generating circuit, arranged to generate a ternary signal and a quaternary signal;
    a detecting circuit, coupled to the signal generating circuit, wherein the detecting circuit is arranged to determine if a pulse loss phenomenon occurs to the ternary signal to generate a mode selecting signal; and
    a selecting circuit, coupled to the signal generating circuit and the detecting circuit, wherein the selecting circuit is arranged to select and output one of the ternary signal and the quaternary signal to an output stage of the amplifier according to the mode selecting signal.

2. The quaternary/ternary modulation selecting circuit of claim 1, wherein the ternary signal comprises a positive ternary wave and a negative ternary wave, and the detecting circuit comprises:
    a first counting circuit, arranged to generate a first counting signal according to the positive ternary wave and the negative ternary wave, wherein the first counting signal has a first logic value when a predetermined number of pulses in the positive ternary wave have been counted while no pulse in the negative ternary wave has been counted;
    a second counting circuit, arranged to generate a second counting signal according to the positive ternary wave and the negative ternary wave, wherein the second counting signal has a second logic value when a predetermined number of pulses in the negative ternary wave have been counted while no pulse in the positive ternary wave has been counted;
    a pulse loss determining circuit, coupled to the first counting circuit and the second counting circuit, wherein the pulse loss determining circuit is arranged to generate a determining signal according to at least the first counting signal and the second counting signal; and
    an output circuit, coupled to the pulse loss determining circuit, wherein the output circuit is arranged to generate the mode selecting signal according to at least the determining signal;
wherein when the determining signal indicates that the first counting signal has the first logic value at least once and the second counting signal has the second logic value at least once, the mode selecting signal instructs the selecting circuit to select and output the quaternary signal to the output stage of the amplifier.

3. The quaternary/ternary modulation selecting circuit of claim 2, wherein the pulse loss determining circuit comprises:
    a pulse loss logic circuit, coupled to the first counting circuit and the second counting circuit, wherein the pulse loss logic circuit is arranged to generate a pulse loss signal according to the first counting signal and the second counting signal;
    a zero-crossing detecting circuit, arranged to perform a zero-crossing detection upon an input signal of the amplifier to generate a zero-crossing signal; and
    a latching circuit, coupled to the pulse loss logic circuit and the zero-crossing detecting circuit, wherein the latching circuit is arranged to receive the pulse loss signal and the zero-crossing signal, and output the pulse loss signal as the determining signal to the output circuit when the zero-crossing signal indicates the input signal of the amplifier reaches a zero voltage level.

4. The quaternary/ternary modulation selecting circuit of claim 2, wherein the quaternary signal comprises a positive quaternary wave and a negative quaternary wave, and the detecting circuit further comprises:
    a zero-level detecting circuit, arranged to generate a zero-level indicating signal to the output circuit according to the positive quaternary wave, the negative quaternary wave, the positive ternary wave and the negative ternary wave;
wherein the output circuit outputs the determining signal as the mode selecting signal when the zero-level indicating signal indicates that the positive quaternary wave, the negative quaternary wave, the positive ternary wave and the negative ternary wave are all at a zero voltage level.

5. The quaternary/ternary modulation selecting circuit of claim 4, wherein the output circuit comprises:
    a latching circuit, arranged to receive the determining signal, the zero-level indicating signal, and a reset signal;
wherein when the reset signal has a third logic value, the latching circuit is reset, and the mode selecting signal is outputted to instruct the selecting circuit to select and output the ternary signal to the output stage of the amplifier when the zero-level indicating signal indicates that the positive quaternary wave, the negative quaternary wave, the positive ternary wave and the negative ternary wave are all at a zero voltage level.

6. The quaternary/ternary modulation selecting circuit of claim 1, wherein the ternary signal comprises a positive ternary wave and a negative ternary wave, and the detecting circuit comprises:
    a first counting circuit, arranged to generate a first counting signal according to the positive ternary wave and the negative ternary wave, wherein the first counting signal has a first logic value when a predetermined number of pulses in the positive ternary wave have been counted while no pulse in the negative ternary wave has been counted;
    a second counting circuit, arranged to generate a second counting signal according to the positive ternary wave and the negative ternary wave, wherein the second counting signal has a second logic value when a predetermined number of pulses in the negative ternary wave have been counted while no pulse in the positive ternary wave has been counted;
    a pulse loss determining circuit, coupled to the first counting circuit and the second counting circuit, wherein the pulse loss determining circuit is arranged to generate a determining signal according to at least the first counting signal and the second counting signal;

an output circuit, coupled to the pulse loss determining circuit, wherein the output circuit is arranged to generate the mode selecting signal according to at least the determining signal; and a reset circuit, coupled to the pulse loss determining circuit, wherein the reset circuit is arranged to generate a reset signal to the pulse loss determining circuit according to the positive ternary wave and the negative ternary wave;

wherein when the reset signal has a third logic value, the pulse loss determining circuit is reset, and the determining signal indicates the first counting signal does not have the first logic value and the second counting signal does not have the second logic value is outputted to the output circuit;

wherein when the determining signal which indicates the first counting signal does not have the first logic value and the second counting signal does not have the second logic value is received, the mode selecting signal instructs the selecting circuit to select and output the ternary signal to the output stage of the amplifier.

7. The quaternary/ternary modulation selecting circuit of claim 6, wherein when a time period indicative of the first counting signal not having the first logic value and the second counting signal not having the second logic value reaches a predetermined length, the reset signal generated by the reset circuit has the third logic value.

8. The quaternary/ternary modulation selecting circuit of claim 6, wherein the quaternary signal comprises a positive quaternary wave and a negative quaternary wave, and the detecting circuit further comprises:

a zero-level detecting circuit, arranged to generate a zero-level indicating signal to the output circuit according to the positive quaternary wave, the negative quaternary wave, the positive ternary wave and the negative ternary wave;

wherein the output circuit outputs the determining signal as the mode selecting signal when the zero-level indicating signal indicates that the positive quaternary wave, the negative quaternary wave, the positive ternary wave and the negative ternary wave are all at a zero voltage level.

9. The quaternary/ternary modulation selecting circuit of claim 8, wherein the output circuit comprises:

a latching circuit, arranged to receive the determining signal, the zero-level indicating signal, and a reset signal;

wherein when the reset signal has a third logic value, the latching circuit is reset, and the mode selecting signal is outputted to instruct the selecting circuit to select and output the ternary signal to the output stage of the amplifier when the zero-level indicating signal indicates that the positive quaternary wave, the negative quaternary wave, the positive ternary wave and the negative ternary wave are all at a zero voltage level.

10. A quaternary/ternary modulation selecting method of an amplifier, comprising:

generating a ternary signal and a quaternary signal;

determining if a pulse loss phenomenon occurs to the ternary signal to generate a mode selecting signal; and selecting and outputting one of the ternary signal and the quaternary signal to an output stage of the amplifier according to the mode selecting signal.

11. The quaternary/ternary modulation selecting method of claim 10, wherein the ternary signal comprises a positive ternary wave and a negative ternary wave, and generating the mode selecting signal at least according to the ternary signal comprises:

generating a first counting signal according to the positive ternary wave and the negative ternary wave, wherein the first counting signal has a first logic value when a predetermined number of pulses in the positive ternary wave have been counted while no pulse in the negative ternary wave has been counted;

generating a second counting signal according to the positive ternary wave and the negative ternary wave, wherein the second counting signal has a second logic value when a predetermined number of pulses in the negative ternary wave have been counted while no pulse in the positive ternary wave has been counted;

generating a determining signal according to at least the first counting signal and the second counting signal; and generating the mode selecting signal according to at least the determining signal;

wherein when the determining signal indicates that the first counting signal has the first logic value at least once and the second counting signal has the second logic value at least once, the mode selecting signal instructs to select and output the quaternary signal to the output stage of the amplifier.

12. The quaternary/ternary modulation selecting method of claim 11, wherein generating the determining signal according to at least the first counting signal and the second counting signal comprises:

generating a pulse loss signal according to the first counting signal and the second counting signal; and performing a zero-crossing detection upon an input signal of the amplifier to generate a zero-crossing signal;

receiving the pulse loss signal and the zero-crossing signal; and outputting the pulse loss signal as the determining signal when the zero-crossing signal indicates the input signal of the amplifier reaches a zero voltage level.

13. The quaternary/ternary modulation selecting method of claim 11, wherein the quaternary signal comprises a positive quaternary wave and a negative quaternary wave, and generating the mode selecting signal at least according to the ternary signal further comprises:

generating a zero-level indicating signal according to the positive quaternary wave, the negative quaternary wave, the positive ternary wave and the negative ternary wave;

wherein the determining signal is outputted as the mode selecting signal when the zero-level indicating signal indicates that the positive quaternary wave, the negative quaternary wave, the positive ternary wave and the negative ternary wave are all at a zero voltage level.

14. The quaternary/ternary modulation selecting method of claim 13, wherein generating the mode selecting signal at least according to the determining signal further comprises:

receiving the determining signal, the zero-level indicating signal, and a reset signal;

wherein when the reset signal has a third logic value, the mode selecting signal instructive to select and output the ternary signal to the output stage of the amplifier is outputted when the zero-level indicating signal indicates that the positive quaternary wave, the negative quaternary wave, the positive ternary wave and the negative ternary wave are all at a zero voltage level.

15. The quaternary/ternary modulation selecting method of claim 10, wherein the ternary signal comprises a positive ternary wave and a negative ternary wave, and generating the mode selecting signal at least according to the ternary signal comprises:
  generating a first counting signal according to the positive ternary wave and the negative ternary wave, wherein the first counting signal has a first logic value when a predetermined number of pulses in the positive ternary wave have been counted while no pulse in the negative ternary wave has been counted;
  generating a second counting signal according to the positive ternary wave and the negative ternary wave, wherein the second counting signal has a second logic value when a predetermined number of pulses in the negative ternary wave have been counted while no pulse in the positive ternary wave has been counted;
  generating a determining signal according to at least the first counting signal and the second counting signal;
  generating the mode selecting signal according to at least the determining signal; and
  generating a reset signal according to the positive ternary wave and the negative ternary wave;
wherein when the reset signal has a third logic value, the determining signal indicates the first counting signal does not have the first logic value and the second counting signal does not have the second logic value is outputted to the output circuit;
wherein when the determining signal which indicates the first counting signal does not have the first logic value and the second counting signal does not have the second logic value is received, the mode selecting signal instructive to select and output the ternary signal to the output stage of the amplifier is generated.

16. The quaternary/ternary modulation selecting method of claim 15, wherein when a time period indicative of the first counting signal not having the first logic value and the second counting signal not having the second logic value reaches a predetermined length, the reset signal has the third logic value.

17. The quaternary/ternary modulation selecting method of claim 15, wherein the quaternary signal comprises a positive quaternary wave and a negative quaternary wave, and generating the mode selecting signal at least according to the ternary signal further comprises:
  generating a zero-level indicating signal according to the positive quaternary wave, the negative quaternary wave, the positive ternary wave and the negative ternary wave;
wherein the determining signal is outputted as the mode selecting signal when the zero-level indicating signal indicates that the positive quaternary wave, the negative quaternary wave, the positive ternary wave and the negative ternary wave are all at a zero voltage level.

18. The quaternary/ternary modulation selecting method of claim 17, wherein generating the mode selecting signal at least according to the determining signal further comprises:
  receiving the determining signal, the zero-level indicating signal, and a reset signal;
wherein when the reset signal has a third logic value, the mode selecting signal instructive to select and output the ternary signal to the output stage of the amplifier is outputted when the zero-level indicating signal indicates that the positive quaternary wave, the negative quaternary wave, the positive ternary wave and the negative ternary wave are all at a zero voltage level.

* * * * *